United States Patent [19]

Kemner et al.

[11] Patent Number: 4,689,565
[45] Date of Patent: Aug. 25, 1987

[54] NUCLEAR MAGNETIC RESONANCE APPARATUS HAVING A COMMUNICATION SYSTEM

[75] Inventors: Rudolf Kemner; Gerardus L. J. Reuvers, both of Eindhoven, Netherlands

[73] Assignee: U.S. Philips Corporation, New York, N.Y.

[21] Appl. No.: 748,241

[22] Filed: Jun. 24, 1985

[30] Foreign Application Priority Data

Jun. 27, 1984 [NL] Netherlands .................... 8402024

[51] Int. Cl.$^4$ ........................................... G01R 33/20
[52] U.S. Cl. ..................................... 324/309; 324/318
[58] Field of Search ............... 128/653; 324/309, 318, 324/322; 179/101, 107 E, 146 R, 146 H, 147, 157

[56] References Cited

U.S. PATENT DOCUMENTS 4,484,658 11/1984 Grote .................... 179/146 R X

Primary Examiner—Michael J. Tokar
Assistant Examiner—Francis J. Jaworslin
Attorney, Agent, or Firm—Robert T. Mayer; Algy Tamoshunas

[57] ABSTRACT

In a nuclear magnetic resonance apparatus, a loudspeaker element free of magnetic material acts as an acoustic reproduction element. The loudspeaker element is arranged in the magnet space so that the main field of the magnet acts to generate a Lorentz driving force for the element. Together with a microphone function or an additional microphone (50) and an external loudspeaker.microphone system, a two-way acoustic communication system can thus be formed. Such a loudspeaker element free from magnetic material does not produce field disturbances in the magnet.

7 Claims, 4 Drawing Figures

NUCLEAR MAGNETIC RESONANCE APPARATUS HAVING A COMMUNICATION SYSTEM

BACKGROUND OF THE INVENTION

The invention relates to a nuclear magnetic resonance apparatus having a main magnet system for producing a uniform steady main magnetic field in an examination space and an acoustic communication system between the examination space and the environment.

In "Radiology", Volume 149, No. 3, p. 855 there is described a communication system for use in medical nuclear magnetic resonance examination. The system described therein is provided with a pair of bellows by means of which acoustic information can be transmitted through a pipe via air-pressure displacements. Such a system has disadvantages, such as the necessity for the patient to be able to operate the bellows, the communication is comparatively poor in information and acts in one direction, the positioning of the bellows and further components of the system, etc.

The problem for a communication system in a nuclear magnetic resonance apparatus is that the magnetic field in the examination space must not be disturbed thereby. With the use of a conventional loudspeaker, this will be the case, however.

SUMMARY OF THE INVENTION

The object of the invention is to reduce or eliminate the said disadvantages and for this purpose a nuclear magnetic resonance apparatus of kind mentioned in the opening paragraph is characterized in that the acoustic communication system is provided with a loudspeaker element which is free of magnetic material which is arranged in the region by the main magnetic field and for which the main magnetic field occurring therein acts to generate a Lorentz driving force.

Due to the fact that in a nuclear magnetic resonance apparatus according to the invention a loudspeaker element (diaphragm) is used which is conventional with respect to sound reproduction, a satisfactory form of communication rich in information from the environment to the examination space is realized without the necessity for providing in the magnetic field, a magnetic material which would disturb the magnetic field. For communication from the examination space to the exterior enviroment, use may be made of such a loudspeaker element, but alternatively a microphone free from magnetic material may be used for this purpose.

In a preferred embodiment, the loudspeaker element comprises a loudspeaker cone which is secured to one side of a preferably substantially rectangular coil, the opposite side of which is fixed locally in a defined position. Preferably, for this purpose the coil is provided on a carrier having a suitable flexibility so that the free end of the carrier including the coil, to which a loudspeaker cone is secured, can be set into vibration. The coil may alternatively be arranged so as to be rotatable about an axis in a manner such that one or both ends are movable. The return force required may then be produced by a resilient element, for example by the loudspeaker cone itself. Essentially, in the case of a rotation about the center of the coil, a loudspeaker can be mounted on either side. A satisfactory phase correlation has then to be ensured. This may have the advantage that the system can be made less directional.

BRIEF DESCRIPTION OF THE DRAWINGS

A few embodiments according to the invention will now be described more fully with reference to the drawings. In the drawings.

DESCRIPTION OF THE PREFERRED EMBODIMENTS

Figure 1:
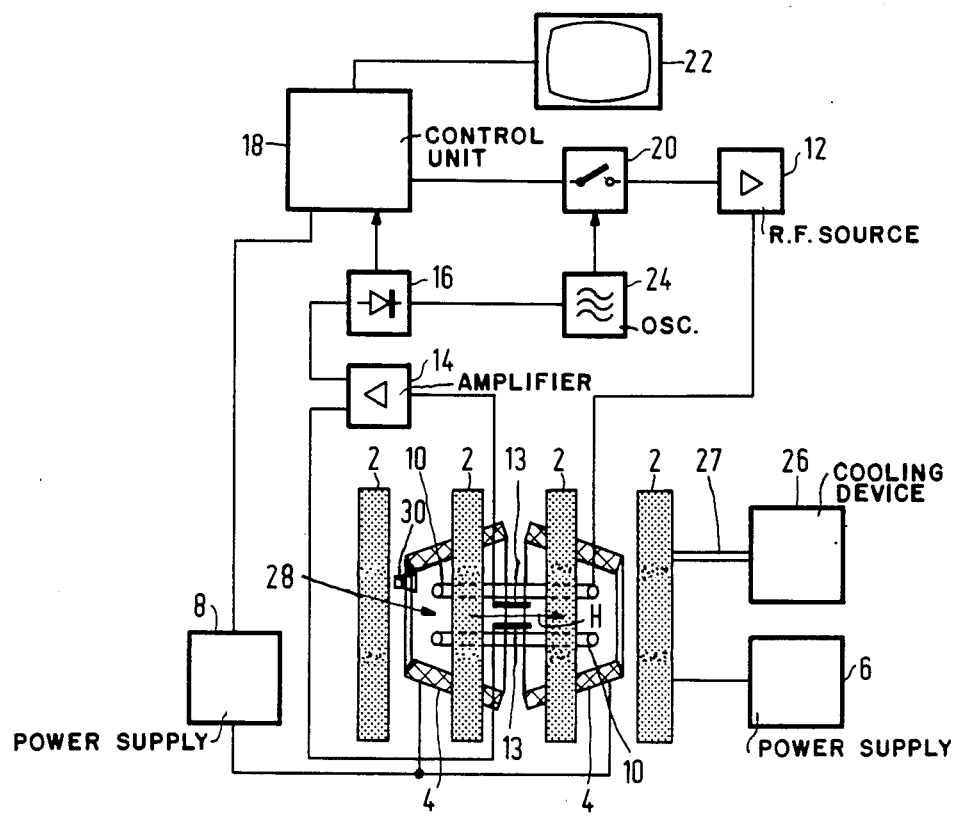
FIG. 1 shows an outline of a nuclear magnetic resonance apparatus provided with an acoustic communication system according to the invention.

A nuclear magnetic resonance apparatus as shown in FIG. 1 comprises a magnet system 2 for producing a steady uniform magnetic field H, a magnet system 4 for producing magnetic gradient fields and supply sources 6 and 8, as required, for the magnet system 2 and the magnet system 4, respectively. A coil 10 serves to produce a radio-frequency alternating magnetic excitation field and is connected for this purpose to a radio-frequency source 12. Nuclear magnetic resonance signals produced by the radio-frequency excitation field in an object under examination, may be detected either by the coil 10 or, for example, by two surface coils 13. For detection, the measurement coils are connected to a signal amplifier 14. The signal amplifier 14 is connected to a phase-sensitive rectifier 16, which is connected to a central control unit 18. The central control unit 18 further controls a modulator 20 for the radio-frequency source 12, the supply source 8 for the gradient coils and the monitor 22 for picture display. A high-frequency oscillator 24 controls both the modulator 20 and the phase-sensitive rectifier 16 processing measurement signals. Magnet coils for the main field may be cooled by means of a cooling device 26 with cooling ducts 27. Such a cooling device may be constructed to provide water cooling for resistance coils or liquid helium cooling for superconducting magnet coils. The excitation coils 10 arranged within the magnet systems 2 and 4 enclose a measurement space 28, which in an apparatus for medical diagnostic measurement is sufficiently large to enclose patients within wide size limits. Thus, there are produced within the measurement space 28 a uniform magnetic field H, gradient fields required for position selection of cross-sections to be displayed and a spatially uniform radio-frequency alternating field.

The space within the magnet system, in which at least the main field H prevails, according to the invention, accommodates a coil with a loudspeaker element 30. A microphone may be added to the loudspeaker element for communicating from the measurement space to the environment. Alternatively, the loudspeaker itself may be used as a microphone.

Figure 2:
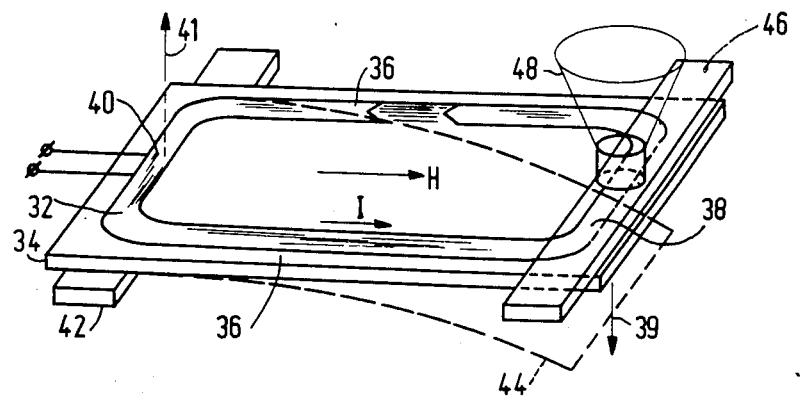
FIG. 2 shows diagrammatically a loudspeaker element with a coil and a loudspeaker cone provided on a carrier for such a communication system.

A loudspeaker element of the kind shown in FIG. 2 comprises a coil 32 provided on a carrier 34. In this case, the carrier is a comparatively thin flexible plate, for example a printed plate of polyester having dimensions of about $10 \times 5$ cm$^2$ and a thickness of about 0.1 mm. The coil provided on the carrier comprises, for example, 50 to 100 turns and has, for example, a resistance of 50Ω. The coil is arranged in the apparatus so that the parts 36 of the winding, designated hereinafter as the windings in the longitudinal direction, coincide with the direction of the main magnetic field H in situ. Therefore, these winding parts will not be subjected to Lorentz forces. Winding parts 38 and 40, which as a result of this positioning are directed at right angles to the main field, will be subjected to a Lorentz force when conveying current. In the indicated direction of the magnetic field H and of a current I through the coil, the latter act in the direction of the arrows 39 and 41. By means of a support 42, the position of the carrier with the coil is fixed locally in the region of the winding part 40 and therefore the Lorentz force cannot therefore produce a displacement at that point. The Lorentz force exerted on the freely arranged winding part 38 will cause the carrier 34 to bend into a shape indicated by dotted lines 44. A supporting plate 46 mounted on a carrier then ensures that this displacement is fully transferred to a loudspeaker cone 48 of the loudspeaker element. Thus, acoustic information can be transmitted by exciting the coil. It will be appreciated that the coil may alternatively, for example, be elliptical. Preferably, the coil will then be arranged so that the major axis of the ellipse extends in the direction of the magnetic field H, but, just as in the case of a rectangular coil, this is not necessary. A second, preferably similar, coil may be provided on the lower side of the carrier 34. Both coils can then be connected in parallel or in series depending upon the required electronic matching impendance. Likewise, each of the coils on one side of the carrier may be comprised of several component coils each having an impedance of, for example, 25Ω, connected in parallel.

Instead of a flexible carrier, in which the displacement is determined entirely by bending the carrier, a less flexible or quite rigid carrier may be used. The carrier is then secured to a support 42 so as to be rotatable about an axis at right angles to the longitudinal direction of the coil. In both embodiments, the support 42 may also be arranged at the center of the coil. By means of the support 42, the loudspeaker element may be secured on an inner side of the magnet system of the nuclear magnetic resonance apparatus. It may then during all examinations occupy the same fixed position and consequently need not be adapted to the position or orientation of a patient. Calculations have shown that, in any event for apparatus having field strengths from 0.5 Tesla, the main field H is amply sufficient for actuating such a loudspeaker element. It can also be calculated that the gradient fields and the radio-frequency transmission fields to be used in the nuclear magnetic resonance examination will not adversely affect the loudspeaker element. Furthermore, it follows from calculations that when the lead-in wires for the coil are twisted, the field in the measurement space is not adversely affected by the magnetic field of the lead-in wires or of the coil of the loudspeaker element.

Figure 3:
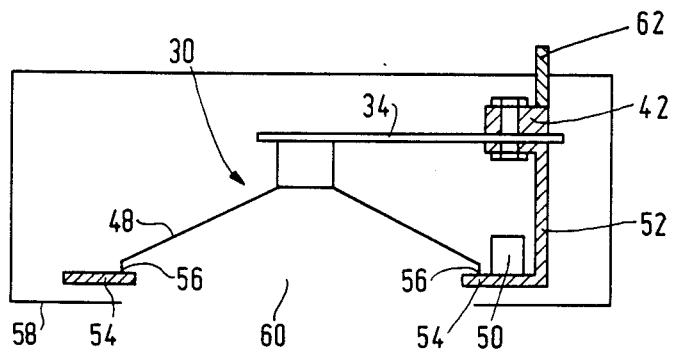
FIG. 3 shows a practical embodiment of acoustic elements for such a communication system.

In a practical embodiment, an electrostatic microphone, for example, is added to the loudspeaker element for communication from the measurement space to the environment. It is recommended that the lead-in wires of the microphone, as fas as they are situated in the field space, should also be twisted. A practical embodiment of a loudspeaker element 30 with a microphone 50 is shown in FIG. 3. The carrier 34 with the coil, is clamped in a supporting plate 42, which in this case is secured through a comparatively rigid plate 52, to a carrier plate 54, on which an end 56 of the loudspeaker cone 48 is secured. The assembly is accommodated in a box 58 with an opening 60 for the loudspeaker. The supporting plate 42 has a connection 62 for mounting the assembly in a magnet system. The box 58 can also be suspended from the connection 62.

Figure 4:
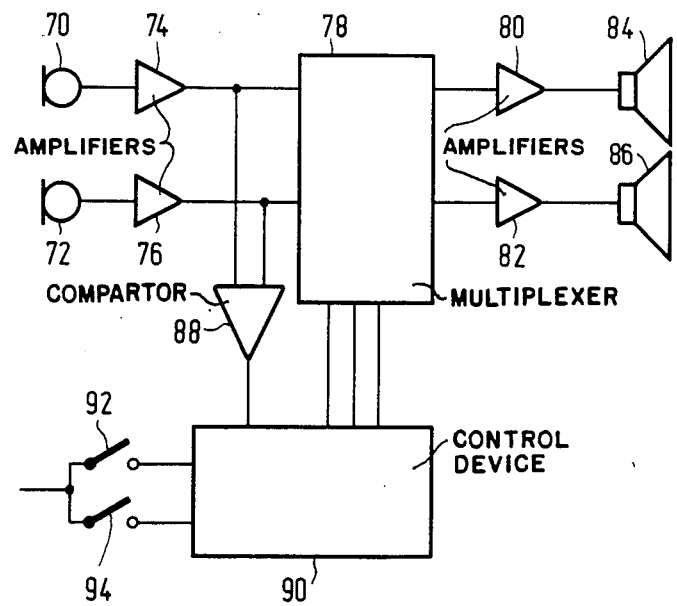
FIG. 4 is a block diagram illustrating a bidirectional communication system.

FIG. 4 shows a block circuit diagram for a communication system having a loudspeaker element such as that described above. A microphone 70 to be activated by a physician or other user, and a microphone 72 to be activated by a patient, are both coupled through amplifiers 74 and 76 to a multiplex circuit 78. A loudspeaker element 84 for the physician and a loudspeaker element 86 of the kind described for the patient are also coupled through amplifiers 80 and 82 to the multiplex circuit. The microphone inputs are further coupled through a dual comparator 88 to a control device 90 with switches 92 and 94. The control device is also coupled to the multiplex circuit 78. By means of the switch 92 of the control device, the physician can switch on, for example, the desired microphone and can temporarily switch off the patient's microphone, for example, for passing on information to the patient. On the other hand, for example, by means of the switch 94, the physician can keep the patient's microphone switched on continuously. When one of the switches 92 or 94 is not activated, the dual comparator determines which microphone is active, for example, dependent upon the strength of the signal thereof. With the use, for example, of electrostatic microphones, because of the desired high input impedance thereof, the pre-amplifiers 74 and 76 are constructed as FET pre-amplifiers. If desired, a volume control may be added to the multiplex circuit for each of the two acoustic connections.

What is claimed is:

1. A nuclear magnetic resonance apparatus comprising means for producing a uniform, steady main magnetic field in an examination space and means for acoustically communicating between said examination space and the exterior environment, said communicating means comprising loudspeaker means which is free from magnetic material, said loudspeaker means being arranged in a region which is permeated by said main magnetic field so that said magnetic field generates a Lorentz force for driving said loudspeaker means.

2. The apparatus according to claim 1 wherein said loudspeaker means comprises a coil winding, means for locally clamping said coil winding to prevent displacement thereof while leaving a free end which is moveable by said Lorentz force generated by said magnetic field, and a loudspeaker cone secured to said free end.

3. The apparatus according to claim 2 wherein said loudspeaker means comprises a flexible carrier, said coil winding being arranged on said carrier, said clamping means clamping one end of said carrier and said loudspeaker cone being secured to the end of said carrier opposite said one end.

4. The apparatus according to claim 2 wherein said clamping means includes means for locally rotatably securing said coil winding to a fixed support.

5. The apparatus according to claim 2 wherein said coil winding is substantially rectangular and is clamped on one side, said loudspeaker cone being secured to the other side of said coil winding.

6. The apparatus according to claim 1 comprising a microphone disposed in said region permeated by said main magnetic field, said microphone being free from magnetic material.

7. The apparatus according to claim 1 wherein said communicating means is a two-way acoustic communication system comprising said loudspeaker means.

* * * * *

UNITED STATES PATENT AND TRADEMARK OFFICE
CERTIFICATE OF CORRECTION

PATENT NO. : 4,689,565

DATED : August 25, 1987

INVENTOR(S) : Rudolf Kemner et al

It is certified that error appears in the above-identified patent and that said Letters Patent is hereby corrected as shown below:

Claim 1, line 7    after "material," insert

--and means for supporting-- line 7    delete "being"

line 8    delete "arranged"

Signed and Sealed this

Thirteenth Day of June, 1989

*Attest:*

DONALD J. QUIGG

*Attesting Officer*    *Commissioner of Patents and Trademarks*